United States Patent
Chopra et al.

(10) Patent No.: US 7,220,663 B2
(45) Date of Patent: May 22, 2007

(54) CONDUCTIVE CONNECTION FORMING METHODS, OXIDATION REDUCING METHODS, AND INTEGRATED CIRCUITS FORMED THEREBY

(75) Inventors: Dinesh Chopra, Boise, ID (US); Fred Fishburn, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/916,751

(22) Filed: Aug. 11, 2004

(65) Prior Publication Data

US 2005/0009318 A1   Jan. 13, 2005

Related U.S. Application Data

(60) Division of application No. 10/620,468, filed on Jul. 15, 2003, which is a continuation of application No. 09/518,511, filed on Mar. 3, 2000, now Pat. No. 6,613,671.

(51) Int. Cl.
  *H01L 21/44* (2006.01)
(52) U.S. Cl. .............. 438/612; 257/E21.509
(58) Field of Classification Search ........ 438/612–617, 438/686, 687, 692, 584, 597, 598, 652
See application file for complete search history.

(56) References Cited

U.S. PATENT DOCUMENTS

| | | | |
|---|---|---|---|
| 3,826,886 A | 7/1974 | Hara et al. | |
| 3,839,727 A | 10/1974 | Herdzik et al. | |
| 3,839,780 A | 10/1974 | Freedman et al. | |
| 3,887,994 A | 6/1975 | Ku et al. | |
| 3,921,200 A * | 11/1975 | Pille ............................ 257/765 |
| 4,319,967 A | 3/1982 | Vratny et al. | |
| 4,393,096 A | 7/1983 | Gajda | |
| 4,565,586 A | 1/1986 | Church et al. | |
| 4,698,233 A | 10/1987 | Ohira et al. | |
| 5,071,714 A | 12/1991 | Rodbell et al. | |
| 5,096,508 A | 3/1992 | Breedis et al. | |

(Continued)

FOREIGN PATENT DOCUMENTS

EP   0288776 A2 *   2/1988

(Continued)

*Primary Examiner*—Scott B. Geyer
(74) *Attorney, Agent, or Firm*—Wells St. John P.S.

(57) ABSTRACT

A conductive connection forming method includes forming a first layer comprising a first metal on a substrate and forming a second layer comprising a second metal different from the first metal on the first layer. At least a part of the first layer may be transformed to an alloy material comprising the first and second metals. A conductive connection may be formed to the alloy material. The alloy material may be less susceptible to formation of metal oxide compared to the first metal. By way of example, transforming the first layer may comprise annealing the first and second layer. An exemplary first metal comprises copper, and an exemplary second metal comprises aluminum, titanium, palladium, magnesium, or two or more such metals. The alloy material may be an intermetallic. A conductive connection may be formed to the alloy layer. An integrated circuit includes a semiconductive substrate, a layer comprising a first metal over the substrate, and a layer of alloy material within the first metal comprising layer. The alloy material layer may comprise the first metal and a second metal different from the first metal. The alloy material may be an intermetallic. A conductive connection may be formed on the alloy layer.

10 Claims, 4 Drawing Sheets

U.S. PATENT DOCUMENTS

| | | | |
|---|---|---|---|
| 5,258,329 A | 11/1993 | Shibata | |
| 5,272,015 A | 12/1993 | Hamdi et al. | |
| 5,296,653 A | 3/1994 | Kiyota et al. | |
| 5,360,995 A | 11/1994 | Graas | |
| 5,378,660 A | 1/1995 | Ngan et al. | |
| 5,390,141 A | 2/1995 | Cohen et al. | |
| 5,455,195 A | 10/1995 | Ramsey et al. | |
| 5,518,936 A | 5/1996 | Yamamoto et al. | |
| 5,547,881 A | 8/1996 | Wang et al. | |
| 5,565,378 A | 10/1996 | Harada et al. | |
| 5,592,024 A | 1/1997 | Aoyama et al. | |
| 5,656,546 A | 8/1997 | Chen | |
| 5,656,860 A | 8/1997 | Lee | |
| 5,700,735 A * | 12/1997 | Shiue et al. | 438/612 |
| 5,788,830 A | 8/1998 | Sakamoto et al. | |
| 5,851,922 A | 12/1998 | Bevk et al. | |
| 5,885,896 A | 3/1999 | Thakur et al. | |
| 5,891,513 A | 4/1999 | Dubin et al. | |
| 5,898,222 A | 4/1999 | Farooq et al. | |
| 6,030,895 A | 2/2000 | Joshi et al. | |
| 6,069,075 A | 5/2000 | McTeer | |
| 6,100,195 A | 8/2000 | Chan et al. | |
| 6,107,179 A * | 8/2000 | Zomorrodi et al. | 438/612 |
| 6,107,687 A | 8/2000 | Fukada et al. | |
| 6,110,819 A | 8/2000 | Colgan et al. | |
| 6,110,829 A | 8/2000 | Besser et al. | |
| 6,140,236 A | 10/2000 | Restaino et al. | |
| 6,146,988 A | 11/2000 | Ngo et al. | |
| 6,147,000 A | 11/2000 | You et al. | |
| 6,171,949 B1 | 1/2001 | You et al. | |
| 6,171,960 B1 | 1/2001 | Lee | |
| 6,172,421 B1 | 1/2001 | Besser et al. | |
| 6,174,810 B1 | 1/2001 | Islam et al. | |
| 6,174,812 B1 | 1/2001 | Hsiung et al. | |
| 6,214,731 B1 | 4/2001 | Nogami et al. | |
| 6,261,939 B1 | 7/2001 | Skala et al. | |
| 6,261,950 B1 | 7/2001 | Tobben et al. | |
| 6,306,750 B1 | 10/2001 | Huang et al. | |
| 6,323,131 B1 | 11/2001 | Obeng et al. | |
| 6,329,722 B1 | 12/2001 | Shih et al. | |
| 6,358,849 B1 | 3/2002 | Havemann et al. | |
| 6,417,575 B2 * | 7/2002 | Harada et al. | 257/784 |
| 6,444,567 B1 | 9/2002 | Besser et al. | |
| 6,468,906 B1 | 10/2002 | Chan et al. | |
| 6,495,200 B1 | 12/2002 | Chan et al. | |

FOREIGN PATENT DOCUMENTS

| | | |
|---|---|---|
| GB | 2184288 A | 6/1988 |
| JP | 362120037 A * | 6/1987 |
| JP | 404280979 A | 10/1992 |
| JP | 6-69270 | 6/1994 |

* cited by examiner

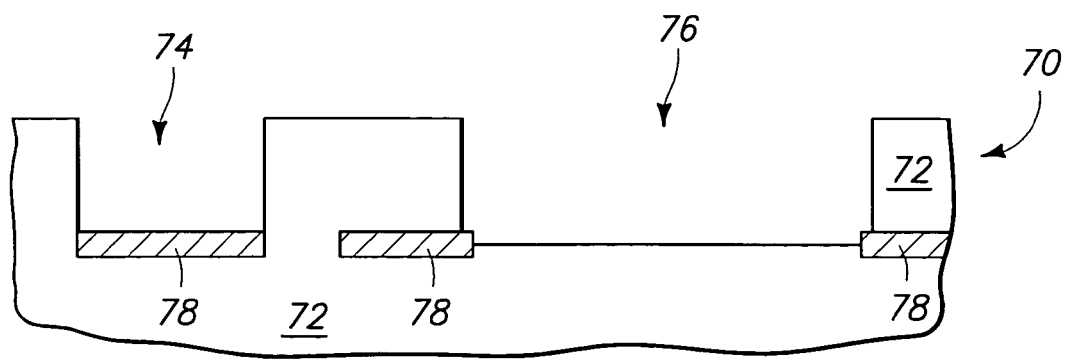
_FIG_ 7
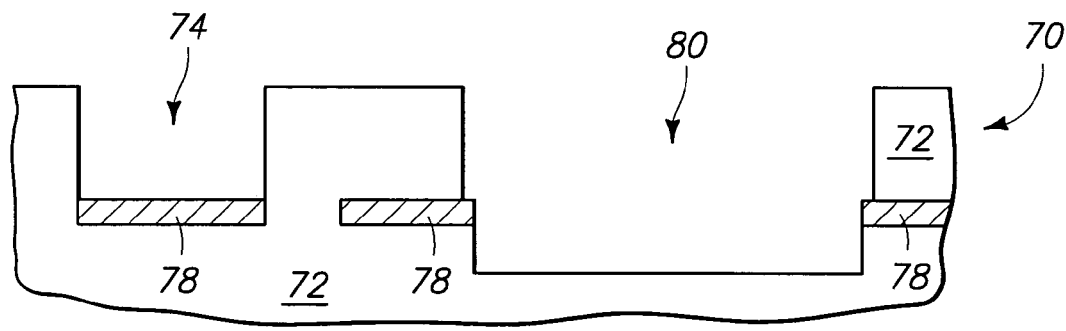
_FIG_ 8
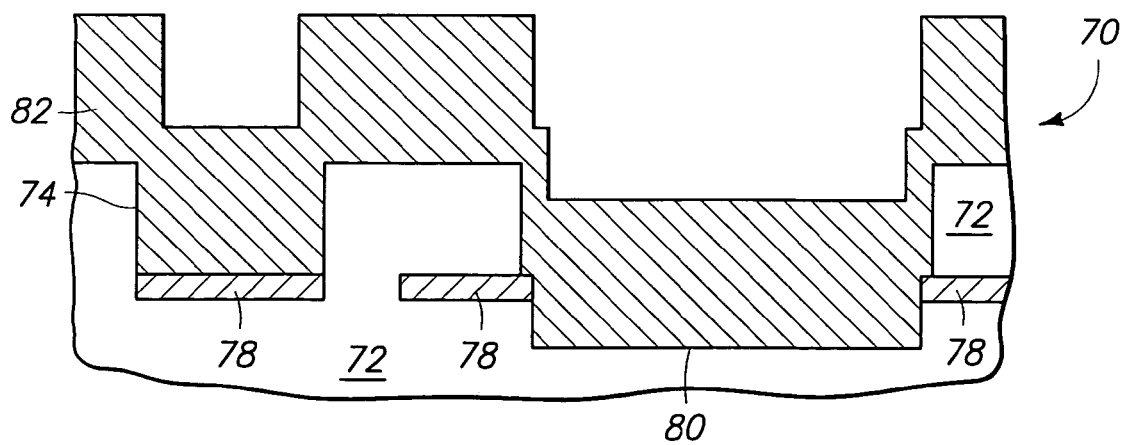
_FIG_ 9

CONDUCTIVE CONNECTION FORMING METHODS, OXIDATION REDUCING METHODS, AND INTEGRATED CIRCUITS FORMED THEREBY

RELATED PATENT DATA

This patent resulted from a divisional application of U.S. patent application Ser. No. 10/620,468, filed Jul. 15, 2003 which resulted from a continuation application of U.S. patent application Ser. No. 09/518,511, filed on Mar. 3, 2000 now U.S. Pat. No. 6,613,671.

TECHNICAL FIELD

This invention relates to methods of forming conductive connections, methods of reducing oxidation, oxidation protection methods, methods of forming integrated circuit structures, such as conductive interconnects and wire bonds, and integrated circuits formed thereby.

BACKGROUND OF THE INVENTION

Several advantages exist for using copper metalization in integrated circuits, such as semiconductor devices. However, copper metalization may be more susceptible to oxidation under certain process conditions as compared to other metals, such as aluminum. Semiconductor devices often include at least two primary metal layers with interconnections between such layers. The first metal layer can be a so-called "metal 1" layer and the second can be a so-called "metal 2" layer.

The first metal layer may be formed on a substrate and covered by a dielectric material, such as silicon dioxide. An opening for an interconnect may then be formed through the dielectric material to expose the first metal layer. The opening may be formed by patterning a layer of photoresist deposited over the dielectric and etching portions of the dielectric material exposed through the photoresist. A common process for removing photoresist comprises ashing. Such removal of a photoresist exposes the first metal layer to the ashing conditions, potentially oxidizing the first metal layer. Copper is particularly susceptible to oxidation at high temperature processing, such as processing at 200° C. or higher.

One method for reducing oxidation of the first metal layer includes forming a layer of silicon nitride over the first metal layer prior to forming dielectric material over the first metal layer. The dielectric material is then processed as indicated above with formation of a photoresist, patterning of the photoresist, etching, and photoresist removal by ashing. However, after etching an opening for a conductive interconnect, a separate etch of the silicon nitride may be used to expose the first metal layer preparatory to forming a conductive interconnect to such layer. A high level of selectivity may often be provided for etching the silicon nitride compared to etching the dielectric material, such as silicon dioxide. The two-step etch process and highly selective etch of silicon nitride add a level of complexity to such processing that is undesirable.

Accordingly, new methods are desired for forming conductive connections between first and second metal layers in semiconductor devices that reduce oxidation of copper without introducing undue complexity to processing.

SUMMARY OF THE INVENTIONS

In one aspect of the invention, a conductive connection forming method includes forming a first layer comprising a first metal on a substrate and transforming at least a part of the first layer to a transformed material comprising the first metal and a second substance different from the first metal. A conductive connection may be formed to the first layer by way of the transformed material. The method may further include forming a second layer comprising a second metal different from the first metal on the first layer. The transformed material may be an alloy material comprising the first and second metals. The alloy material may be less susceptible to formation of metal oxide compared to the first metal. By way of example, transforming the first layer may comprise annealing the first and second layer. An exemplary alloy includes an intermetallic. An exemplary first metal comprises copper, and an exemplary second metal comprises aluminum, titanium, palladium, magnesium, or two or more such metals.

Further, another aspect of the invention includes a conductive connection forming method wherein a first layer comprising copper is formed over a substrate. A second layer of a second metal different from the copper may be formed over the first layer. At least some of the second metal may be incorporated into an intermetal layer comprising the second metal and copper. The method further includes removing at least a portion of any second metal not incorporated into the intermetal layer and exposing the intermetal layer. A conductive connection may be formed to the intermetal layer.

Such methods may be used as oxidation reducing methods or methods for protecting metal containing material from oxidation during semiconductor processing. Such methods are also conducive to use in methods of forming integrated circuit interconnects or integrated circuit wire bonds.

In another aspect of the invention, an integrated circuit includes a semiconductive substrate, a layer comprising a first metal over the substrate, and a layer of alloy material within the first metal comprising layer. The alloy material layer may comprise the first metal and a second metal different from the first metal. A conductive connection may be formed on the alloy layer.

BRIEF DESCRIPTION OF THE DRAWINGS

Preferred embodiments of the invention are described below with reference to the following accompanying drawings.

FIG. 7 shows a fragmentary sectional view of a semiconductive wafer at one step of a method according to another aspect of the invention.

FIGS. 8–12 each show the semiconductive wafer fragment of FIG. 7 at successive steps.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

In one aspect of the present invention, a conductive connection forming method includes forming a first layer comprising a first metal on a substrate. In the context of this document, layers or materials "comprising metal" or "metal-comprising" layers or materials are defined to mean any layer or material containing at least one metallic element, regardless of whether the layer or material exhibits metallic properties. For example, a metal-comprising layer or material may be a metal oxide, nitride, sulfide, or other substance even though such substance might not exhibit metallic properties.

Figure 1:
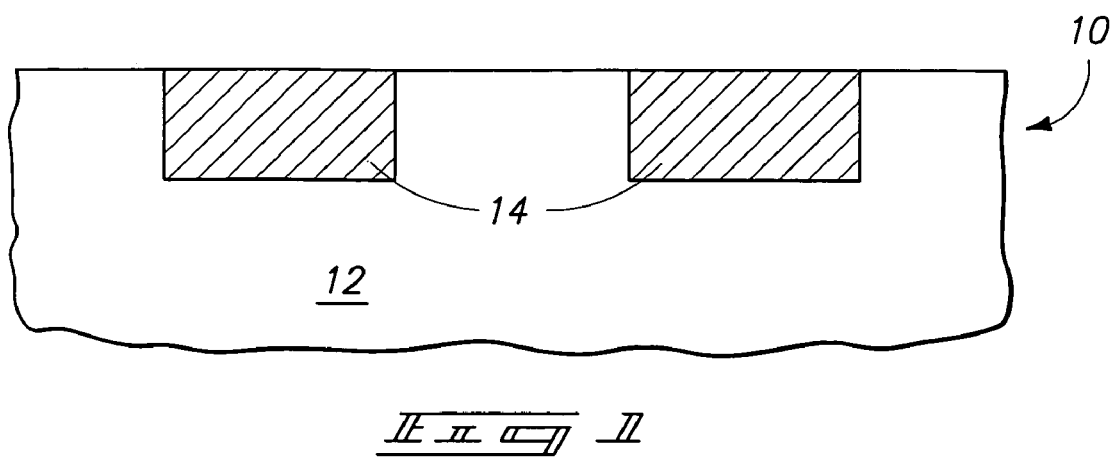
FIG. 1 shows a fragmentary sectional view of a semiconductive wafer at one step of a method according to one aspect of the invention.

Turning to FIG. 1, a wafer portion 10 is shown having an insulation layer 12 and a metal-comprising layer 14 formed on insulation layer 12. Wafer portion 10 of FIG. 1 is one example of a first layer comprising a first metal formed on a substrate. Metal-comprising layer 14 may be a variety of structures and compositions having a variety of functions. Metal-comprising layer 14 can comprise copper, aluminum, another metal, or two or more such metals. Further, layer 14 may consist essentially of one or more metallic elements, such as the metals and metal combinations listed above. In alternative to FIG. 1, insulation layer 12 may comprise other materials, such as semiconductive or conductive materials. Further, even though FIG. 1 shows metal-comprising layer 14 and insulation layer 12 as part of wafer portion 10, the invention is applicable to a variety of substrates and technology areas. Wafer portion 10 may comprise part of a semiconductor device, an integrated circuit device, or other devices and apparatuses.

In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Figure 2:
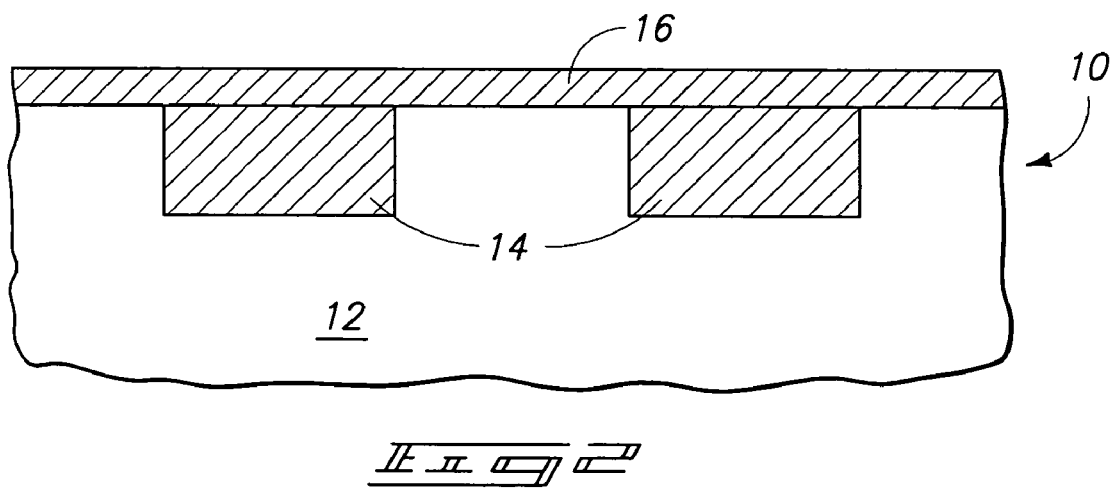
FIG. 2 shows the semiconductive wafer fragment of FIG. 1 at a step subsequent to that shown in FIG. 1.

Accordingly, metal-comprising layer 14 may be formed over a semiconductive substrate. After formation of metal-comprising layer 14, a second layer comprising a second metal different from the first metal in metal-comprising layer 14 may be formed on metal-comprising layer 14. FIG. 2 shows a metal-comprising layer 16, comprising a second metal, formed on metal-comprising layer 14. Metal-comprising layer 16 may include, for example, aluminum, titanium, palladium, magnesium, another metal, or two or more such metals. Further, layer 16 may consist essentially of one or more metallic elements, such as the metals and metal combinations listed above. Layers 14 and 16 may comprise, in addition to metallic elements, non-metallic elements, depending on the particular application of the present invention and processing conditions. Metal-comprising layer 16 may have a thickness of about 150 to about 800 Angstroms. Preferably, metal-comprising layer 16 may have a thickness of about 400 to about 500 Angstroms.

The present aspect of the invention further includes transforming at least a part of the first layer to an alloy material comprising the first and second metals. Alternatively, the present aspect of the invention may include incorporating at least some of the second metal into an alloy layer comprising the second metal and the first metal. The indicated transforming may comprise annealing the first and second layer. Similarly, the indicated incorporating may also comprise annealing the first and second layer. Annealing may occur at a temperature of about 400° C. to about 500° C. The alloy material may consist essentially of the first and second metals. Also, the alloy material may comprise an intermetallic material. In the context of this document, an "intermetallic" material is a type of metal alloy wherein the constituents are held together by metallic bonding. Alloys also include other materials that are not held together by metallic bonding. An intermetallic material may exhibit properties as described below that are advantageous in the present invention. However, it is also conceivable that alloys may exist that exhibit similar properties, but are not intermetals. Although the aspects of the invention are discussed herein primarily with reference to intermetals, one of ordinary skill will appreciate that alloys that are not intermetals may also be suitable.

Figure 3:
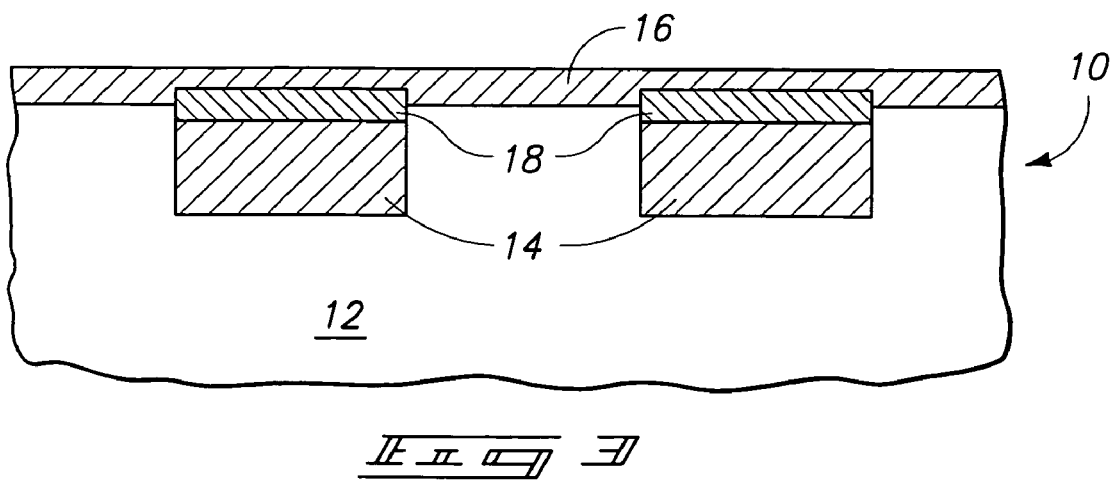
FIG. 3 shows the semiconductive wafer fragment of FIG. 1 at a step subsequent to that shown in FIG. 2.

Turning to FIG. 3, an intermetallic material 18 is shown as a result of transforming part of metal-comprising layer 16 to an intermetallic material comprising the first and second metals of layers 14 and 16, respectively. In the present aspect of the invention, about 50 to about 300 Angstroms of metal-comprising layer 14 may be transformed to the intermetallic material or, preferably, about 150 Angstroms. A variety of thicknesses for intermetallic material 18 are conceivable and may be desired, depending on the application of the invention as described herein or otherwise. FIG. 3 shows that intermetallic material 18 exists beyond the original thickness of first metal layer 14. It is also conceivable that forming intermetallic material 18 will not add substantially to the original thickness of first metal layer 14.

It is preferred that intermetallic material 18 consist essentially of the first metal of layer 14 and the second metal of layer 16. It is also preferred that intermetallic material 18, or another alloy material exhibit the property of being less susceptible to the formation of metal oxide in comparison to the first metal of layer 14. Such a property, as well as other properties, may allow intermetallic material 18 to reduce oxidation of metal-comprising layer 14 during subsequent processing. Oxidation of metal-comprising layer 14 can potentially reduce the conductivity of conductive connections formed to metal-comprising layer 14. Accordingly, the present aspect of the invention further includes forming a conductive connection to the intermetallic material, or another alloy material. Examples of a conductive connection include an integrated circuit interconnect, an integrated circuit wire bond, and other structures.

Intermetallic material 18, or another alloy material, may also advantageously exhibit the property of having approximately the same resistivity as metal-comprising layer 14. Examples of particularly advantageous intermetallic materials include intermetals of titanium or aluminum with copper, specifically, $TiCu_3$. Such intermetals exhibit approximately the same resistivity as copper. Such intermetals are also much less susceptible to formation of metal oxide compared to copper. Accordingly, providing such intermetals as intermetallic material 18 may reduce the oxidation of copper in processing subsequent to formation of such intermetal.

Figure 4:
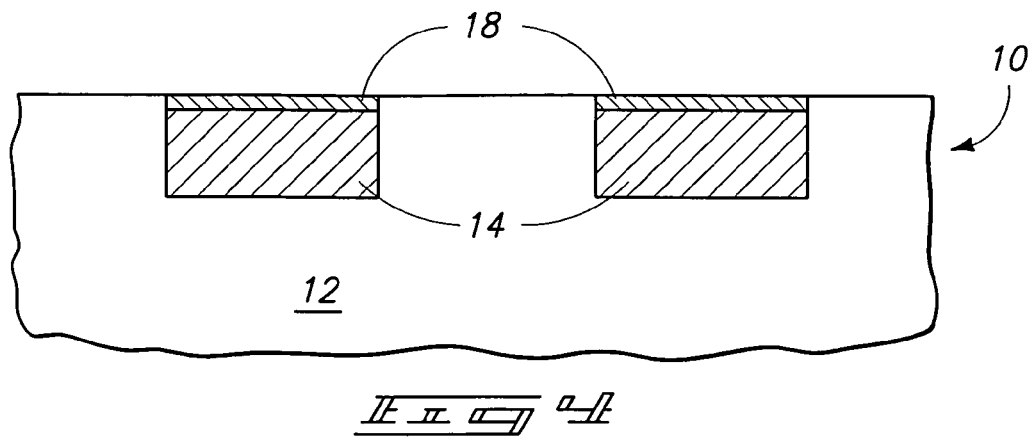
FIG. 4 shows the semiconductive wafer fragment of FIG. 1 at a step subsequent to that shown in FIG. 3.
Figure 5:
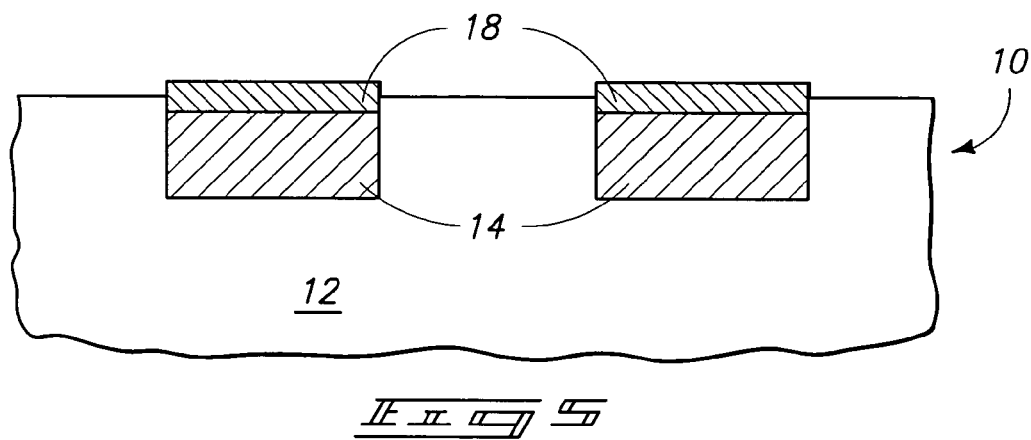
FIG. 5 shows the semiconductive wafer fragment of FIG. 1 at an alternative step subsequent to that shown in FIG. 3.

Depending on the particular application of the invention, it may be desirable to remove some portion of metal-comprising layer 16, intermetallic material 18, and/or metal-comprising layer 14. A variety of processing scenarios are conceivable. For example, substantially all of metal-comprising layer 16 not comprised by intermetallic material 18 may be removed. FIGS. 4 and 5 both present examples of such removal. In FIG. 4, the portion of intermetallic material 18 beyond the original thickness of metal-comprising layer 14 is shown removed along with substantially all of metal-comprising layer 16. Such a removal leaves behind only the portion of intermetallic material 18 formed within metal-comprising layer 14. Such removal may be accomplished by a variety of processes.

A non-selective etch or chemical mechanical polishing are two examples of potential processes. As shown in FIG. 4, such processes, as well as other processes, may be used to also remove any portion of metal-comprising layer 16 not comprised by the intermetallic material. Removing "substantially" all of a material may allow insignificant portions of such material to remain provided that the central objective of the removal is accomplished. One possible objective for removing metal-comprising layer 16 is to prevent electrical shorts between other conductive structures, such as the two portions of metal-comprising layer 14 shown in FIGS. 1–6.

In alternative to the above-described methods, the objective of avoiding electrical shorts, as well as other objectives, may be met by instead removing at least some of metal-comprising layer 16 not comprised by intermetallic material 18. A sufficient thickness of intermetallic material 18 may be left behind to reduce oxidation of metal-comprising layer 14. The potential additional objective of exposing intermetallic material 18 may be met by such an alternative process as well as by the other previously mentioned processes for removing metal-comprising layer 16.

Turning to FIG. 5, an alternative structure is shown that may result from the latter-mentioned processes for removing metal-comprising layer 16. In FIG. 5, substantially all of metal-comprising layer 16 is removed without removing a substantial portion of intermetallic material 18. Not removing a "substantial" portion at a material means that if any removal occurs, such removal is not sufficient to prevent the central objective of providing such material. Such a removal process may be accomplished by a selective etch of metal-comprising layer 16 in preference to intermetallic material 18. The selectivity ratio of layer 16 removal to material 18 removal may greater than 5 to 1, for example, approximately 10 or more to 1. One potential selective etch includes exposure of metal-comprising layer 16 to a halogenated acid, such as HF or HCl, or other acids, such as $H_2SO_4$ and $HNO_3$, or combinations thereof. Such exposure may be effective to remove either titanium or aluminum metal substantially selectively to copper intermetals with titanium or aluminum. A conductive connection may then be formed to the exposed intermetal material 18 as described above. It is also conceivable within the present aspect of the invention that some portion of metal-comprising layer 16 will remain, rather than removing substantially all of such material. For example, only a portion of metal-comprising layer 16 sufficient to expose intermetallic material 18 may be removed, still allowing formation of a conductive connection.

Another aspect of the invention includes an oxidation reducing method wherein a layer comprising a first metal may be contacted with a second metal different from the first metal while treating the layer in contact with the second metal. The method includes forming an intermetallic material at least partially within the layer, the intermetallic material comprising the first and second metals. Further, substantially all of any residual second metal not comprised by the intermetallic material may be removed from over the intermetallic material. A conductive connection to the intermetallic material may be formed without forming a substantial amount of metal oxide on the first metal. Treating the layer in contact with the second metal may comprise annealing the layer. From the text associated with FIGS. 1–5 above, it can be seen that such figures provide one example of an oxidation reducing method.

In an oxidation protection method, also exemplified by FIGS. 1–5, metal-containing material may be protected during semiconductor processing. A first metal-containing material may be formed over a substrate followed by a second metal-containing material over the first metal-containing material. Annealing the first and second metal-containing materials may form an intermetal material from some of the first material and some of the second material. After annealing, the intermetal material may be exposed to conditions effective to oxidize the first metal-containing material, but the intermetal material may protect at least some of the first metal-containing material from oxidation during the exposing.

Figure 6:
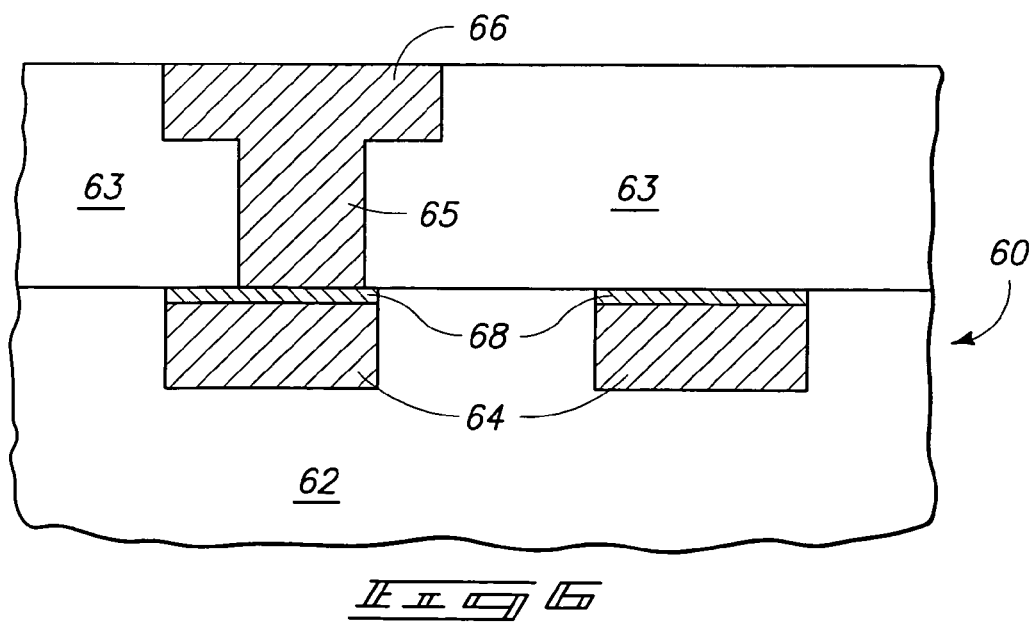
FIG. 6 shows the semiconductive wafer fragment of FIG. 1 at a step subsequent to that shown in FIG. 4.

Turning to FIG. 6, a structure 60 formed by an integrated circuit interconnect forming method is exemplified, illustrating yet another aspect of the invention. In FIG. 6, metal-comprising layer 64 comprises a first level of integrated circuit wiring formed over an insulation layer 62 over a semiconductive substrate (not shown). Intermetallic material 68, or another alloy material, is formed at least partially within such first wiring level and intermetallic material 68 comprises a first metal from metal-comprising layer 64 and a second metal different from the first metal. A conductive interconnect 65 is shown formed through an insulation layer 63 in electrical contact with intermetallic material 68. Conductive interconnect 65 may be formed on intermetallic material 68.

In the present aspect of the invention, forming intermetallic material 68 may comprise forming a layer comprising the second metal on the first wiring level. One example is shown in FIG. 2 wherein metal-comprising layer 16 is formed on metal-comprising layer 14. Forming the intermetallic material may further include annealing the layer and first wiring level and removing at least some of any second metal not comprised by the intermetallic material. A sufficient thickness of intermetallic material may be left behind to reduce oxidation of the first wiring level where conductive interconnect 65 connects to the first wiring level.

FIG. 6 shows conductive interconnect 65 formed from the same material as a second level 66 of integrated circuit wiring. Such a structure may be produced by forming second wiring level 66 over first wiring level 64 during formation of conductive interconnect 65. A dual damascene process or similar process known to those skilled in the art may accomplish formation of such a structure.

Another aspect of the present invention includes an integrated circuit wire bond forming method. Such method involves forming integrated circuit wiring and defining a bond pad in the wiring comprising a first metal. An intermetallic material may be formed at least partially within the bond pad, the intermetallic material comprising the first metal and a second metal different from the first metal. A wire bond may be formed in electrical contact with the intermetallic material.

Turning to FIGS. 7–12, one example of the integrated circuit wire bond forming method is illustrated. FIG. 7 shows a wafer portion 70 including an insulation layer 72 and integrated circuit wiring 78 formed in insulation layer 72. Opening 74 formed in insulation layer 72 exposes a portion of integrated circuit wiring to allow formation of additional wiring within opening 74. Opening 76 is formed in insulation layer 72, exposing integrated circuit wiring 78 to allow formation of a bond pad. In FIG. 8, bond pad opening 76 is extended further into insulation layer 72 forming extended bond pad opening 80. In FIG. 9, a layer of conductive material 82 comprising a first metal is formed over wafer portion 70 to provide conductive material for additional wiring in wiring opening 74 and a bond pad in extended bond pad opening 80.

Figure 10:
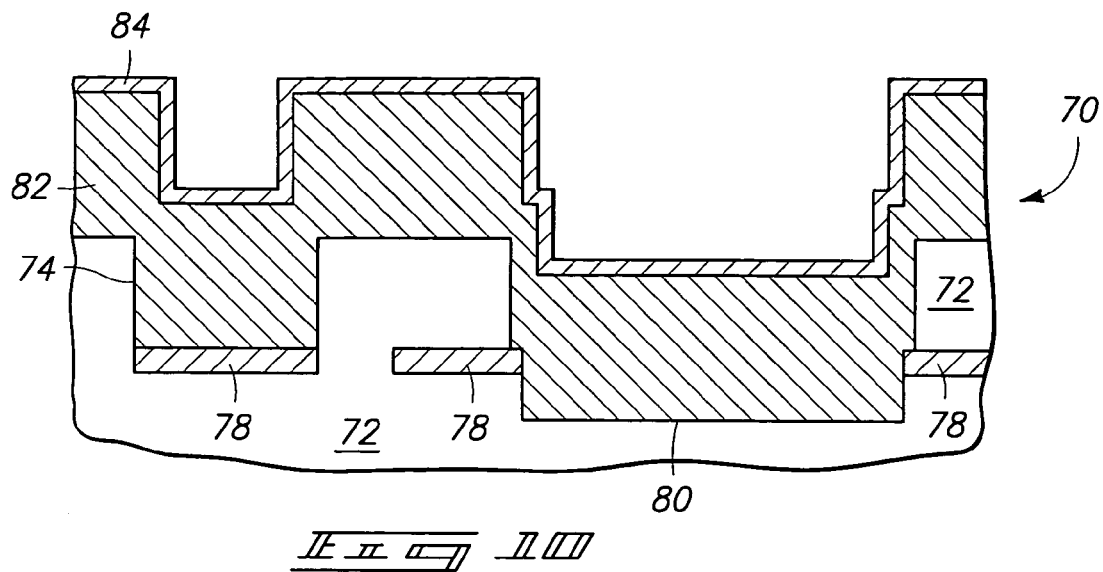

As shown in FIG. 10, a layer 84 comprising a second metal may be formed over conductive layer 82. Formation of second-metal-comprising layer 84 allows formation of an intermetallic material at least partially within the portion of conductive layer 82 within extended bond pad opening 80. Formation of an intermetallic material may be accomplished within extended bond pad opening 80 using processes as described herein. In one such process, layer 84 and conductive layer 82 within bond pad opening 80 are annealed. Such annealing produces wafer portion 70 shown in FIG. 11 having in termetallic material 86, or another alloy material, at least partially within conductive layer 82 within bond pad opening 80. At least some of any second metal not comprised by the intermetallic material may be removed, leaving a sufficient thickness of intermetallic material to reduce oxidation of a bond pad where a wire bond contacts such bond pad.

Figure 11:
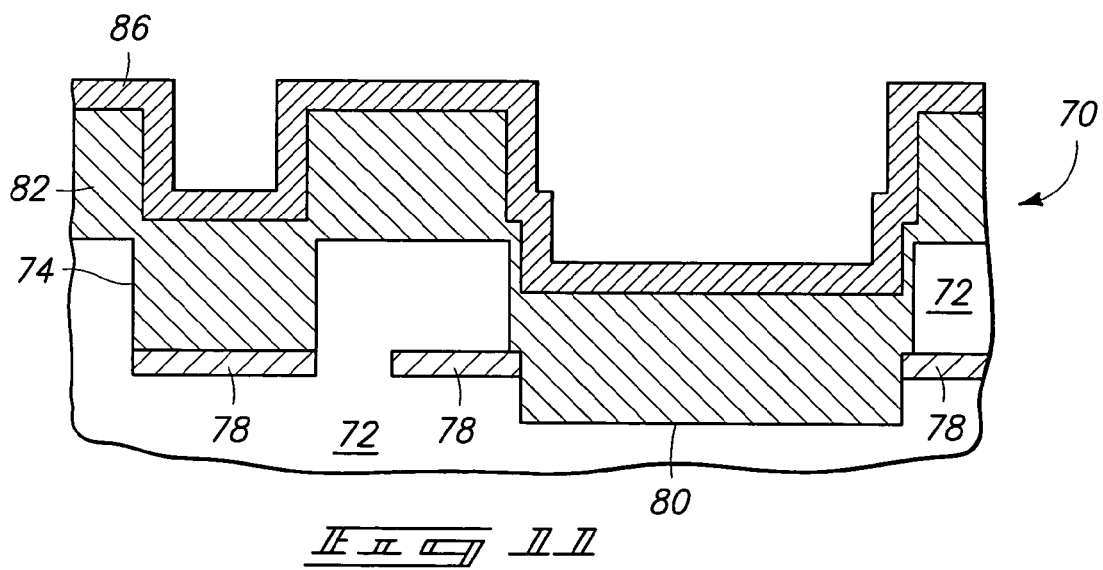

In FIG. 11, substantially all of second-metal-comprising layer 84 is comprised by intermetallic material 86. Such a feature may be practiced with any of the aspects of the invention disclosed herein. That is, substantially all of a thickness of a layer comprising a second metal that exists over a layer comprising a first metal may be transformed to an intermetallic material. In this manner, only intermetallic material, rather than excess second metal from the second-metal-comprising layer will exist over a first-metal-comprising layer.

Figure 12:
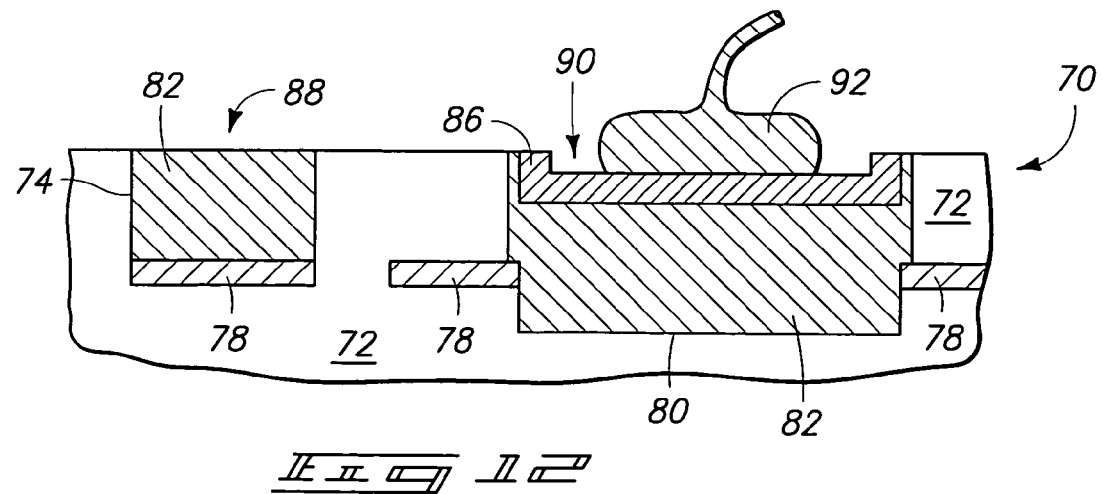

Turning to FIG. 12, excess portions of intermetallic material 86 and conductive layer 82 are shown removed from wafer portion 70. Such removal forms additional integrated circuit wiring 88 from conductive layer 82 within wiring opening 74. Such removal also forms bond pad 90 from intermetallic material 86 and conductive layer 82 within bond pad opening 80. At least one of the effects of extending bond pad opening 76 into insulation layer 72 is formation of bond pad 90 having an outer surface that is topographically below immediately surrounding structures. By extending bond pad opening 76 less deep into insulation layer 72, the outer surface of bond pad 90 may be made level with immediately surrounding structures but still comprise intermetallic material 86. Defining a bond pad as described may provide easy removal of intermetallic material 86 by planarization methods, for example chemical mechanical polishing, from all areas except over conductive layer 82 within bond pad opening 80.

As also seen in FIGS. 9–12, such processing also provides intermetallic material 86 at least partially within bond pad 90. As discussed above regarding other aspects of the invention, intermetallic material may exhibit a property of resistance to oxidation during semiconductor processing. Accordingly, formation of conductivity limiting metal oxide may be reduced when forming a wire bond 92 to bond pad 90. Such is even true when bond pad 90 and wire bond 92 comprise copper.

In the aspects of the invention described above, a transformed material, such as an alloy material or another material, may be formed by still other methods. A conductive connection forming method can include transforming at least a part of metal-comprising layer 14 to a transformed material by ion implanting. Implanting a second substance different from the metal in metal-comprising layer 14 may impart a decreased susceptibility in the transformed material to oxidation compared to the metal. For example, nitrogen or another substance may be implanted into metal-comprising layer 14 to an extent sufficient to decrease oxidation. The nitrogen implant may be sufficiently limited in amount and depth such that a conductive connection may still be formed to the metal-comprising layer 14 by way of the transformed material. Limiting the implant energy may produce a shallow implant of metal-comprising layer 14, thus also limiting any impact on conductivity of metal-comprising layer 14.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. An integrated circuit wire bond forming method comprising:
    forming integrated circuit wiring and defining a bond pad in the wiring comprising a first metal;
    forming an intermetallic material at least partially within the bond pad, the intermetallic material comprising an alloy of the first metal and a second metal different from the first metal, the first and second metals being held together by metallic bonding; and
    forming a wire bond on and in physical and electrical contact with the intermetallic material.

2. The method of claim 1 wherein the forming the intermetallic material comprises:
    forming a layer comprising the second metal on the bond pad;
    annealing the layer and bond pad; and
    removing at least some of any second metal not comprised by the intermetallic material and leaving a sufficient thickness of intermetallic material to reduce oxidation of the bond pad where the wire bond connects to the bond pad.

3. The method of claim 1 wherein, after the defining, the bond pad is topographically below immediately surrounding structures.

4. The method of claim 1 wherein the bond pad and the wire bond comprise copper.

5. The method of claim 1 wherein the second metal comprises aluminum, titanium, palladium, magnesium, or two or more such metals.

6. An integrated circuit wire bond forming method comprising:
    forming integrated circuit wiring in an insulation material;
    forming an opening in the insulation material and exposing at least some of the wiring;
    forming a bond pad in the opening, the bond pad comprising a first metal, contacting the wiring, and having a surface topographically below the insulation material immediately surrounding the bond pad;
    forming a layer on the bond pad surface, the layer comprising a second metal different from the first metal;

annealing the second metal layer and bond pad;

forming an intermetallic material at least partially within the bond pad, the intermetallic material comprising an alloy of the first and second metals, which are held together by metallic bonding and having a surface over the bond pad topographically below the insulation material immediately surrounding the bond pad;

removing substantially all of any intermetallic material elevationally above the insulation material and leaving a sufficient thickness of intermetallic material over the bond pad to reduce oxidation of the bond pad; and forming a wire bond on and in physical and electrical contact with the intermetallic material over the bond pad.

7. The method of claim 6 wherein the wire bond directly contacts the intermetallic material without a passivation layer therebetween.

8. The method of claim 6 wherein the removing comprises chemical mechanical polishing.

9. The method of claim 6 wherein the bond pad comprises copper and the second metal layer comprises at least one of aluminum and palladium.

10. The method of claim 6 wherein the second metal layer comprises palladium.

* * * * *